United States Patent [19]

Holland

[11] Patent Number: 4,794,277

[45] Date of Patent: Dec. 27, 1988

[54] INTEGRATED CIRCUIT UNDER-VOLTAGE LOCKOUT

[75] Inventor: Varnum S. Holland, Amherst, N.H.

[73] Assignee: Unitrode Corporation, Lexington, Mass.

[21] Appl. No.: 85,297

[22] Filed: Aug. 10, 1987

Related U.S. Application Data

[63] Continuation of Ser. No. 818,053, Jan. 13, 1986, abandoned, and a continuation of Ser. No. 546,982, Oct. 31, 1983, abandoned.

[51] Int. Cl.[4] .......................... G05F 3/18; H01L 29/72; H01L 27/04; H03K 17/16

[52] U.S. Cl. ............................ 307/296 R; 307/299.2; 307/296 A; 357/35; 323/231; 323/315

[58] Field of Search ................ 307/299.2, 311, 296 R, 307/297; 357/35, 41, 15, 36, 46, 92; 323/231, 312, 315

[56] References Cited

U.S. PATENT DOCUMENTS

| | | | |
|---|---|---|---|
| 3,820,007 | 6/1974 | Schilling et al. | 357/36 X |
| 3,878,551 | 4/1975 | Callahan, Jr. | 357/48 |
| 3,890,634 | 6/1975 | Ruegg | 357/37 X |
| 3,987,477 | 10/1976 | Krolik | 357/36 |
| 4,035,664 | 7/1977 | Berger et al. | 357/35 X |
| 4,085,411 | 4/1978 | Genesi | 307/311 X |
| 4,146,903 | 3/1979 | Dobkin | 357/35 X |
| 4,158,783 | 6/1979 | Berger et al. | 357/92 X |
| 4,286,177 | 8/1981 | Hart et al. | 357/15 X |
| 4,328,509 | 5/1982 | Lehning | 357/35 X |
| 4,336,489 | 6/1982 | Frederiksen | 323/231 X |
| 4,345,166 | 8/1982 | Allen et al. | 307/299 B X |
| 4,390,829 | 6/1983 | Jarrett | 323/231 |
| 4,396,883 | 8/1983 | Holloway et al. | 307/297 X |

FOREIGN PATENT DOCUMENTS

| | | | |
|---|---|---|---|
| 58-132816 | 8/1983 | Japan | 323/231 |

*Primary Examiner*—Stanley D. Miller
*Assistant Examiner*—David R. Bertelson
*Attorney, Agent, or Firm*—Weingarten, Schurgin, Gagnebin & Hayes

[57] ABSTRACT

A low voltage lockout circuit preferably of integrated circuit form to provide a lockout signal when an internally generated reference voltage is insufficient. According to the present invention, a reference voltage is produced by passing a constant current through a reference voltage element, such as a zener diode. Insufficient reference voltage caused by a low power supply input voltage is detected by sensing the saturation of the constant current source. The present invention indicates the precise point of saturation of the constant current source and produces a lockout signal for use by other portions of the integrated circuit, or external devices. The lockout signal also indicates the minimum usable power supply input voltage. The constant current source and the saturation detection element are combined and implemented within a single semiconductor structure. The semiconductor structure includes a transistor having a second collector, wherein the minority carriers are re-emitted from the first collector upon saturation of the first collector, and received by the second collector; the resulting current produces the lockout signal.

10 Claims, 2 Drawing Sheets

INTEGRATED CIRCUIT UNDER-VOLTAGE LOCKOUT

This application is a continuation of application Ser. No. 818,053, filed Jan. 13, 1986 and Ser. No. 546,982 filed Oct. 31, 1983, both now abandoned.

FIELD OF THE INVENTION

The present invention relates to integrated circuits and more particularly to voltage reference detectors having a lockout signal indicating a low voltage condition.

BACKGROUND OF THE INVENTION

In start-up or quiescent operating conditions, integrated circuits frequently require an indication of an under-voltage condition to hold signals generated in the integrated circuit in an "off" state until the power supply input voltage is of sufficient magnitude to allow the circuit to properly operate. The under-voltage indication is typically provided by directly comparing the input voltage with an internal reference voltage, typically generated by a voltage reference device receiving a constant current. The selected output signals are maintained at the predetermined state until the particular input voltage exceeds the internal reference voltage level. However, to determine if the internally generated reference voltage itself is valid, the reference voltage will typically be compared to a second internally generated reference voltage. Alternately, the status of power supply input voltage is determined by measuring the voltage drop across the reference voltage constant current source with a comparator, wherein a lockout signal is generated when the voltage across the constant current source drops to a low value. However, integrated circuits which incorporate these methods of voltage sensing require additional voltage reference supply components, and a higher power supply input voltage to guarantee that the comparator or the second reference voltage is operable. Moreover, the operability of the primary reference voltage source is presumed from the measured voltages, which voltages may be larger than necessary to provide a reliable signal. Furthermore, lockout signals thusly generated do not provide a true indication of the point at which the voltage reference element begins to provide a regulated reference voltage.

SUMMARY OF THE INVENTION

The present invention includes a novel transistor semiconductor structure which senses the true condition of the voltage reference source by determining the exact point of saturation of the constant current source. The saturation of the constant current source is determined by receiving the minority carriers re-emitted by the constant current transistor when in saturation, through an additional collector disposed on the semiconductor structure adjacent to the first collector, distal from the current source emitter. The second collector then produces a current flow to generate a lockout signal, indicating the saturation of the current source and the under-voltage conditions of the voltage reference output and power supply input signal.

BRIEF DESCRIPTION OF THE DRAWING

These and other features of the present invention will be better understood by reading the following detailed description, together with the drawing, wherein.

DETAILED DESCRIPTION OF THE INVENTION

Figure 1:
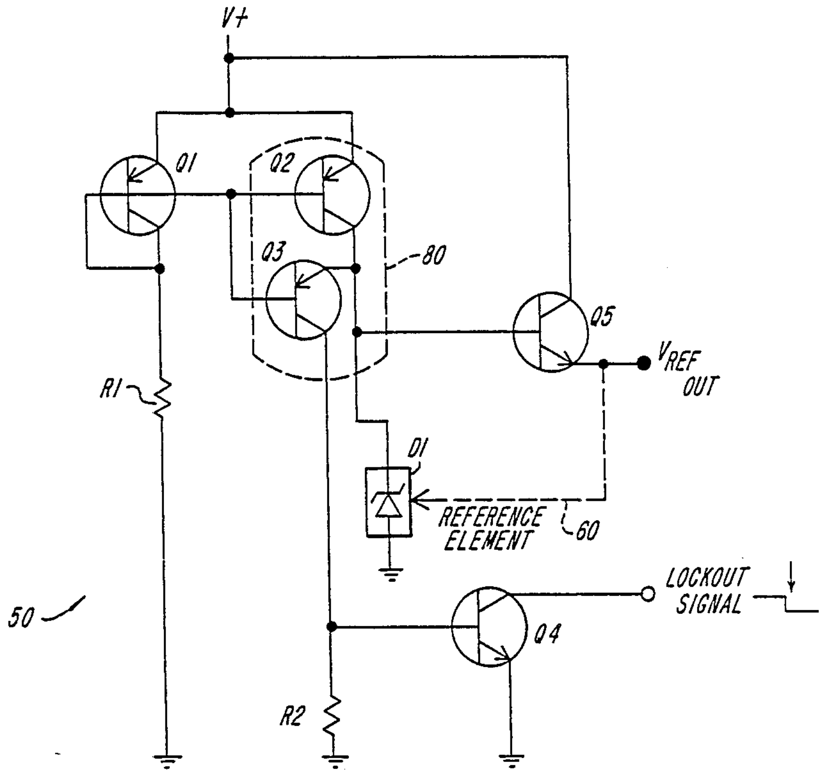
FIG. 1 is a schematic circuit diagram of the under-voltage lockout circuit embodying the invention.

A voltage reference circuit 50 is shown in FIG. 1, which is typically embodied entirely within an integrated circuit assembly to provide a reference voltage signal to other portions (not shown) of the integrated circuit. The reference voltage output signal is derived from a reference element $D_1$, typically comprising a zener diode, band gap reference element, or other constant voltage element known in the art. The reference element is operable to provide the fixed voltage when supplied by a current. The stability of the reference voltage is enhanced by supplying a constant current through the reference element $D_1$. An emitter follower $Q_5$ provides a buffer between the reference element $D_1$ and the external loads. The emitter follower $Q_5$ may be replaced by a variety of buffer circuits, including an operational amplifier of selected gain to provide scaling of the voltage reference signal. Also a reference element $D_1$ can be of a type which receives a feedback signal along path 60 to maintain a constant buffered reference voltage regardless of changes in buffer parameters. The reference element $D_1$ is supplied with a constant current through transistor $Q_2$ is part of a current-mirror topology including transistor $Q_1$ and resistor $R_1$, and is generally implemented within the same integrated circuit to provide the necessary matching of the characteristics of the transistors $Q_1$ and $Q_2$. Alternately, transistor $Q_2$ may be combined with external discrete components (not shown) to form a constant current source.

In normal operation, the input voltage V+ is sufficient in magnitude to allow the collector of transistor $Q_2$ to absorb all minority carriers provided by the emitter. However, as the input voltage V+ decreases, the reference element $D_1$ no longer draws sufficient current from the transistor $Q_2$ to cause the minority carriers to be entirely removed from the collector region. According to the present invention, a secondary transistor $Q_3$ is provided which shares the base structure of transistor $Q_2$. Alternately, transistor $Q_2$ can be described as comprising portions of transistors $Q_2$, plus an additional (second) collector. The transistor $Q_3$ receives a flow of carriers re-emitted from the collector of transistor $Q_2$ when transistor $Q_2$ is saturated. The current flow resulting from the collector of transistor $Q_3$ is used in conjunction with resistor $R_2$ to create a signal corresponding to the saturation level of the current source transistor $Q_2$. A transistor $Q_4$ is used to provide a lockout signal in response to a signal generated across resistor $R_2$ which is selected to provide the voltage necessary to turn on transistor $Q_4$. As mentioned above, the circuit 50 shown in FIG. 1 may be entirely implemented within a larger integrated circuit having other functional portions (not shown).

Figure 2:
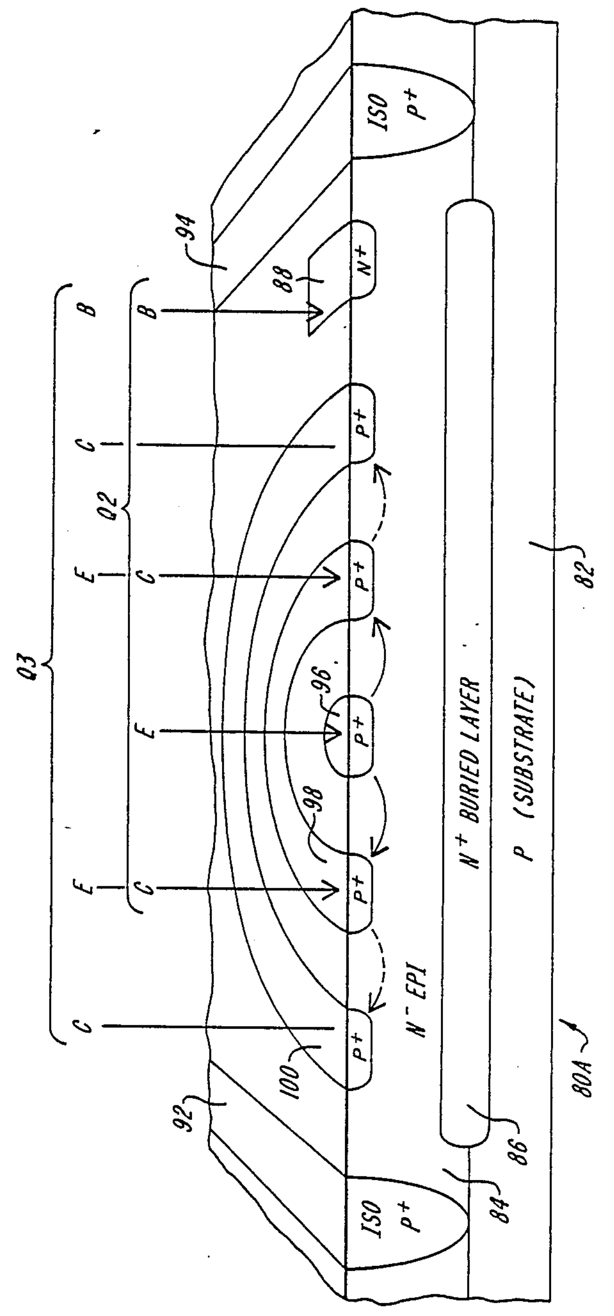
FIG. 2 is an exaggerated cross-sectional view of an integrated circuit embodying a portion of the circuit of FIG. 1.

The particular physical implementation of the transistors $Q_2$ and $Q_3$, shown within the dotted enclosure 80, is shown in the exaggerated cross-section of FIG. 2. The semiconductor structure type 80A includes a substrate 82 formed from a P type material having an N type material 84 expitaxially formed thereupon. A highly doped layer of N+ type material 86 exists on the boundary between the epitaxial layer and the substrate, and serves to form a uniformly distributed base element of the common transistors $Q_2$ and $Q_3$. The base element is formed from an N+ region 88 to which external leads are connected by known techniques. The region 88 electrically communicates with the N+ layer 86 to provide the control of the transistor minority carriers according to known techniques. Isolation regions 92 and 94 are diffused through the epitaxial layer 84. The isolation regions 92 and 94 function to block the migration of carriers to adjacent transistor elements, not shown. The transistor $Q_2$ is formed by the region 88 and concentric annular regions 96 and 98. The emitter region 96 provides a source of minority carriers which is controlled by the base region 88 according to the current flow between the emitter region 96 and the epitaxial layer 84. The collector region 98 receives all of the carriers generated when in an unsaturated condition. When the transistor $Q_2$ becomes saturated, the minority carriers are re-emitted from the collector 98 into the epitaxial layer 84, to be re-collected by a second concentric annular collector 100 formed thereupon. The regions 88, 98, and 100 form the transistor base, emitter and collector elements of transistor $Q_3$ respectively.

According to the present invention, the collector region 100 receives none of the carriers originally produced by the emitter region 96 until the collector region 98 becomes saturated. Therefore, the saturation detector of the present invention indicates the exact point of saturation of the transistor $Q_2$, and therefore the exact minimum voltage at which the associated reference voltage element 52, shown in FIG. 1, will produce a reliable reference voltage.

Moreover, as shown in FIG. 2, the annular deployment of the regions 96, 98, and 100 is preferred since all electrons must first pass the collector region 98 before moving to the second collector region 100. However, alternate implementations or geometries are within the scope of the present invention. Similarly, other modifications, substitutions, and changes in circuit topology such as an alternate current source topology, are within the scope of the present invention, which is not to be limited except according to the claims which follow.

What is claimed is:

1. Voltage reference apparatus for providing a regulated voltage signal and a lockout signal, comprising:

means for providing a constant current including an integrated circuit having a transistor and means for indicating the saturation of said constant current integrated circuit transistor producing said lockout signal; and means for providing a reference voltage connected to receive the constant current produced by said constant current source.

2. The voltage reference apparatus of claim 1, further including:

a buffer amplifier receiving said regulated voltage signal, producing a buffered regulated voltage signal.

3. The voltage reference apparatus of claim 2, wherein said buffer amplifier is an emitter follower amplifier.

4. The voltage reference apparatus of claim 2, wherein said means for providing a reference voltage receives a feedback signal from the output of said buffer amplifier.

5. The voltage reference apparatus of claim 1, wherein said means for providing a constant current comprises a current mirror, further including a second transistor connected to establish the magnitude of the constant current.

6. The voltage reference apparatus of claim 1, further including:

a means for receiving the lockout signal and producing a buffered lockout signal.

7. The voltage reference apparatus of claim 1, wherein said means for indicating comprises a constant current transistor second collector region.

8. A voltage reference circuit having a substrate of a first conductivity type to detect a semiconductor saturation condition providing a regulated voltage and a lockout signal, comprising:

an epitaxially grown base layer of a second conductivity type;

a plurality of conductive regions disposed on the surface of said epitaxially grown base layer in a predetermined order, wherein said plurality of conductive regions comprises:

an emitter of a first conductivity type providing a source of charge;

a first collector of a first conductivity type providing a current source, disposed adjacent said emitter junction to receive said charge therefrom, and having at least a portion of said base layer interposed between said emitter and first collector;

a second collector of the same conductivity type as the first collector, disposed adjacent said first collector on said base layer having at least a portion of said base layer interposed between said first and second collectors, wherein said first collector receiving said charge emits at least a portion of said charge when in a saturated condition, said portion being received by said second collector, providing a saturation output signal therefrom indicating the condition of the second collector; and a voltage reference element connected to said current source providing a selected reference voltage when said current source is operable, said second collector current indicating said current source is not fully operable.

9. The integrated circuit of claim 1, further including a current-mirror circuit including said current source.

10. The integrated circuit of claim 1, wherein said reference element comprises one of a zener diode and a band gap reference element.

* * * * *